(12) United States Patent
Cho et al.

(10) Patent No.: US 10,790,359 B2
(45) Date of Patent: Sep. 29, 2020

(54) INTELLIGENT SEMICONDUCTOR DEVICE HAVING SIGE QUANTUM WELL

(71) Applicant: Gachon University of Industry-Academic cooperation Foundation, Seongnam-si, Gyeonggi-do (KR)

(72) Inventors: Seongjae Cho, Seoul (KR); EunSeon Yu, Seoul (KR)

(73) Assignee: GACHON UNIVERSITY OF INDUSTRY-ACADEMIC COOPERATION (KR)

( * ) Notice: Subject to any disclaimer, the term of this patent is extended or adjusted under 35 U.S.C. 154(b) by 0 days.

(21) Appl. No.: 16/451,639

(22) Filed: Jun. 25, 2019

(65) Prior Publication Data
US 2020/0083329 A1 Mar. 12, 2020

(30) Foreign Application Priority Data
Sep. 12, 2018 (KR) ........................ 10-2018-0108761

(51) Int. Cl.
| H01L 29/12 | (2006.01) |
| H01L 29/10 | (2006.01) |
| H01L 29/423 | (2006.01) |
| H01L 29/792 | (2006.01) |
| H01L 29/06 | (2006.01) |
| H01L 29/165 | (2006.01) |
| H01L 29/08 | (2006.01) |

(52) U.S. Cl.
CPC ........ *H01L 29/122* (2013.01); *H01L 29/0657* (2013.01); *H01L 29/0847* (2013.01); *H01L 29/1095* (2013.01); *H01L 29/165* (2013.01); *H01L 29/42344* (2013.01); *H01L 29/7926* (2013.01)

(58) Field of Classification Search
None
See application file for complete search history.

(56) References Cited

U.S. PATENT DOCUMENTS

| 2008/0057635 A1* | 3/2008 | Chen ................. H01L 29/78696 438/197 |
| 2010/0067301 A1* | 3/2010 | Kim ................. H01L 29/40117 365/185.18 |
| 2012/0084241 A1 | 4/2012 | Friedman et al. |

FOREIGN PATENT DOCUMENTS

KR  10-1425857  7/2014

* cited by examiner

Primary Examiner — Khaja Ahmad
(74) Attorney, Agent, or Firm — Gerald E. Hespos; Michael J. Porco; Matthew T. Hespos

(57) ABSTRACT

An intelligent semiconductor device has a body region in which a channel is formed. The body region has a heterojunction of different semiconductor layers and a quantum well formed in a semiconductor layer in contact with a drain. The quantum well is configured to store holes generated in a depletion layer of the drain region and imitate a short-term memory, and to convert the short-term memory into a long-term memory by enabling holes to be injected into a charge storage layer when the holes stored in quantum well exceed a specific threshold value. It is possible to fabricate with a bulk semiconductor substrate and utilize the conventional CMOS technology.

15 Claims, 4 Drawing Sheets

INTELLIGENT SEMICONDUCTOR DEVICE HAVING SIGE QUANTUM WELL

CROSS-REFERENCE TO RELATED APPLICATION

This application claims priority to Korean Patent Application No. 10-2018-0108761, filed on Sep. 12, 2018, under 35 U.S.C. 119, the entire contents of which are hereby incorporated by reference.

BACKGROUND

Field of the Invention

The present invention relates to a semiconductor device, and more particularly to an intelligent semiconductor device having a SiGe quantum well structure.

Related Art

An intelligent semiconductor device refers to a nerve-mimicking semiconductor device for implementing an artificial intelligence system in hardware.

Artificial intelligence computing, which is an artificial intelligence system based on software, has a disadvantage that it requires a lot of time and money for power consumption and learning. Recently, a new concept of neuromorphic technology has been studied in hardware to replace software-based artificial intelligence.

Many devices have been proposed as a synaptic device for application to the new neuromorphic technology to mimic the biological human brain, but most devices cannot fully mimic the behavior of biological synapses in a single device.

U.S. Patent Publication No. 2012/0084241 discloses a technique for mimicking the Spike-Timing-Dependent Plasticity (STDP) characteristic which involves a change in synaptic weight based on the difference in firing time of pre- and post-synaptic neurons using a phase change material as a synaptic device. However, because of the nature of the phase change material, short-term memory characteristic of the biological synapse cannot be realized, and the short-to-long-term memory conversion characteristic cannot be also implemented.

To solve the above problems, Korean Patent No. 10-1425857 discloses synaptic semiconductor device and operation method thereof, which is capable of mimicking both the short-to-long-term memory conversion characteristic and the causal reasoning characteristic of biological body by time difference of pre- and post-neuron signals.

Korean Patent No. 10-1425857 has the status of an original patent for synaptic semiconductor devices. There has been a continuing demand for the development of a structure capable of operating at low power, a technique capable of utilizing 100% of conventional CMOS technology, and a technique capable of being manufactured at low cost with bulk Si.

In addition, when the synaptic device of the prior art is implemented in a two-terminal structure, there is a problem that a complete synapse operation cannot be simulated, and an additional circuit is required to support an incomplete operation and reliability.

SUMMARY

The present invention has been proposed in order to overcome the problems of the prior art, and it is possible to fabricate with a bulk semiconductor substrate and utilize the conventional CMOS technology. It is also intended to provide an intelligent semiconductor device having a SiGe quantum-well structure, which is composed of four terminals and can operate in a stand-alone type mimicking long-term potentiation characteristics as well as a short-term with a single device.

To achieve the objectives, an intelligent semiconductor device according to the present invention comprises a body region having a first semiconductor layer, a second semiconductor layer, and a heterojunction between the first and the second semiconductor layers; a biasing gate and a control gate spaced apart on the body region and crossing the heterojunction; a first gate insulating layer provided between the biasing gate and the body region; a second gate insulating layer having a charge storage layer formed between the control gate and the body region; a source region provided at one end of the first semiconductor layer; and a drain region provided at one end of the second semiconductor layer.

The second semiconductor layer is recommended to have a smaller energy band gap than the first semiconductor layer, but highly doped Si is also available.

The first semiconductor layer may be formed to protrude vertically on the source region, and the second semiconductor layer and the drain region may be sequentially stacked on the first semiconductor layer.

The body region may be formed by vertically stacking the first semiconductor layer and the second semiconductor layer in a polygonal columnar shape on the source region, and the biasing gate and the control gate may be spaced apart from each other on the sides of the polygonal columnar shape and formed of one or more, respectively.

The source region and the drain region may be horizontally spaced apart on a semiconductor substrate, and the first semiconductor layer and the second semiconductor layer may be formed horizontally between the source region and the drain region.

The source region and the drain region may be horizontally spaced apart on a semiconductor substrate, the first semiconductor layer and the second semiconductor layer of the body region may have a polygonal horizontal bar shape between the source region and the drain region, and the biasing gate and the control gate may be spaced apart from each other on the side of the polygonal horizontal bar shape, the biasing gate and the control gate being one or more, respectively.

The second semiconductor layer may have a quantum well between the depletion layer of the drain region and the heterojunction, and the quantum well may be configured to store holes generated in the depletion layer and imitate a short-term memory, the quantum well converting the short-term memory into a long-term memory by enabling holes to be injected into the charge storage layer when the holes stored in quantum well exceed a specific threshold value.

The first semiconductor layer may be a silicon layer or wide band-gap material such as SiC, and the second semiconductor layer may be a layer of small band-gap material such as silicon germanium.

The silicon layer may be formed of a bulk silicon substrate, the source region being formed in the bulk silicon substrate.

The biasing gate and the control gate may cover the depletion layer and be formed to a distance away from the source region.

The present invention provides an intelligent semiconductor device. A body region in which a channel is formed may have a heterojunction of different semiconductor layers and a quantum well formed in a semiconductor layer in contact with a drain. The quantum well may be configured to store holes generated in a depletion layer of the drain region and imitate a short-term memory, and to convert the short-term memory into a long-term memory by enabling holes to be injected into a charge storage layer when the holes stored in quantum well exceed a specific threshold value. It is possible to fabricate with a bulk semiconductor substrate and utilize the conventional CMOS technology.

In these drawings, the following reference numbers are used throughout: reference number 10 indicates a source region, 20 a drain region, 30 a body region, 31 a heterojunction, 32 a first semiconductor layer, 34 a second semiconductor layer, 40 a first gate insulating film, 50, 52 and 54 a biasing gate, 60 a second gate insulating film, and 70 a control gate.

DETAILED DESCRIPTION

Detailed descriptions of preferred embodiments of the present invention are provided below with accompanying drawings.

Figure 1:
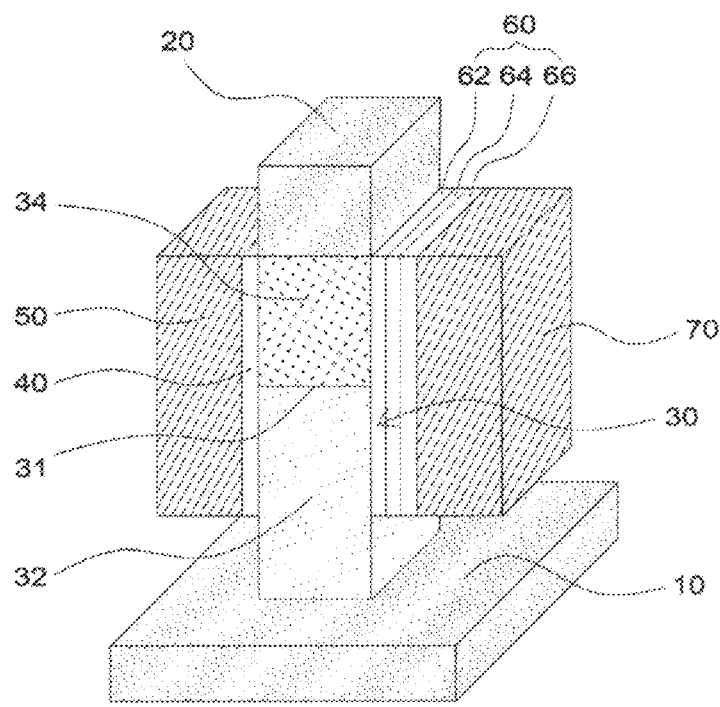
FIGS. 1 and 2 are a perspective view and a cross-sectional view illustrating the structure of an intelligent semiconductor device according to an embodiment of the present invention.
Figure 2:
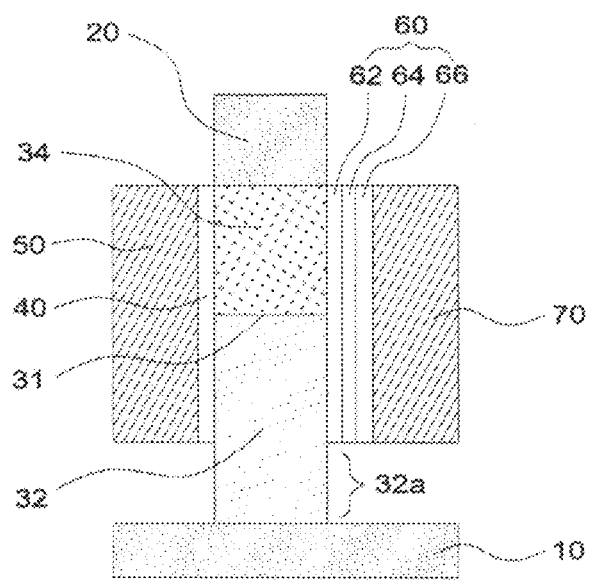

An intelligent semiconductor device according to an embodiment of the present invention comprises, as shown in FIGS. 1 and 2, a body region 30 having a first semiconductor layer 32, a second semiconductor layer 34, and a heterojunction 31 between the first and the second semiconductor layers 32 and 34; a biasing gate 50 and a control gate 70 spaced apart on the body region 30 and crossing the heterojunction 31; a first gate insulating layer 40 provided between the biasing gate 50 and the body region 30; a second gate insulating layer 60 having a charge storage layer 64 formed between the control gate 70 and the body region 30; a source region 10 provided at one end of the first semiconductor layer 32; and a drain region 20 provided at one end of the second semiconductor layer 34.

Here, a quantum well is formed at one side (e.g., 32 or 34) of the body region 30. When pulse voltages corresponding to nerve stimuli are repeatedly input between the drain region 20 and the biasing gate 50 or the control gate 70, the quantum well 32 or 34 stores charges (i.e., electrons or holes). It makes a drain current vary and thereby imitates the short-term memory of the synapse.

The quantum well may be formed at the drain side 34 when holes are to be stored. When electrons are to be stored, it is preferable to form it at the source side 32 or design the device as different doping type. En the following embodiments, the former configuration will be mainly described, but the latter one can also be implemented.

In order to form the quantum well at the drain side 34, the body region 30 may be, as shown in FIG. 1, configured with the first semiconductor layer 32 and the second semiconductor layer 34 connected to the heterojunction 31 in a channel length direction between the source region 10 and the drain region 20.

At this time, the second semiconductor layer 34 contacts the drain region 20 and a depletion layer is formed between them. In order to form the depletion layer, when the drain region 20 is formed in an n-type as usual, the second semiconductor layer 34 may be formed in a p-type.

In the above embodiment, the quantum well is formed in the second semiconductor layer 34 isolated by the heterojunction 31 of one side and the depletion layer of the other drain side.

At this time, the quantum well stores holes generated in the depletion layer when the pulse voltages are applied and imitates the short-term memory. When a specific threshold value is exceeded, holes are injected into the charge storage layer 64 to be converted into a long-term memory.

Here, the specific threshold value refers to the amounts of holes stored in the quantum well in which holes start to be injected into the charge storage layer 64, or the channel potential value corresponding thereto.

In order to more effectively form a quantum well in the second semiconductor layer 34 and to store such enough holes that holes are injected into the charge storage layer 64 to convert to the long-term memory, the second semiconductor layer 34 is preferably formed of a semiconductor material having a smaller energy bandgap than the first semiconductor layer 32.

Especially, it is preferable that the semiconductor material of each of the first and second semiconductor layers 32 and 34 is selected to have a large valence-band offset (VBO) among energy bandgap differences.

Generally, at different synapses the conditions for converting to the long-term memory are different. There are advantages in that the material of the first and second semiconductor layers 32 and 34 may be appropriately selected to meet the above conditions with the valence-band offsets due to the difference in energy bandgap between them.

For example, the first semiconductor layer 32 may be a silicon layer and the second semiconductor layer 34 may be a silicon germanium layer. Here, the silicon layer 32 may be formed integrally with the source region 10 as a bulk silicon substrate.

The biasing gate 50 and the control gate 70 may be overlapped or underlapped for 34 with the body region 30. Preferably, as shown in FIG. 2, they may be overlapped with the drain 20 to cover at least the depletion layer and may be underlapped with the source region 10 to separate a predetermined distance 32*a*.

The hole generation in the depletion layer can be caused by various operations such as band-to-band tunneling, impact ionization, and gate-induced drain leakage (GIDL) between the channel formed in the body region 30 and the drain region 20. Therefore, in a case that band-to-band tunneling is performed, holes in the depletion layer can be generated with lower power than in the other cases.

Figure 3:
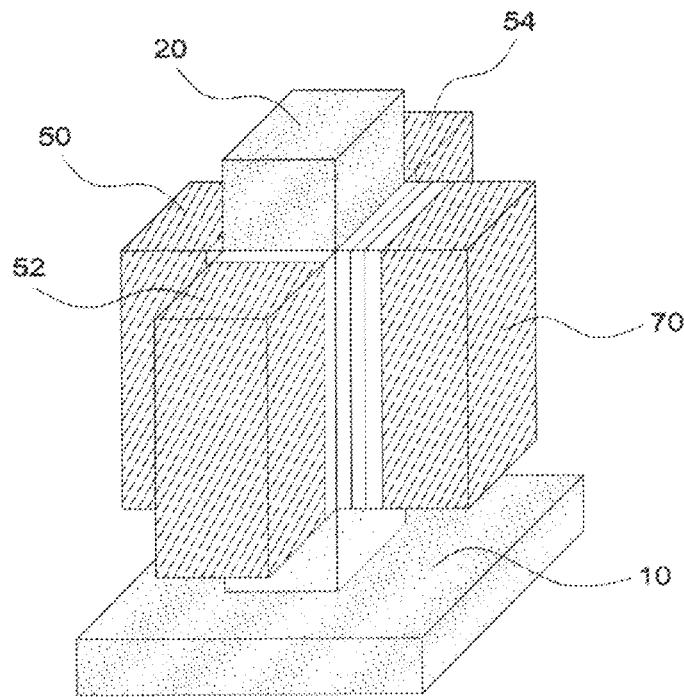
FIG. 3 is a perspective view showing the structure of an intelligent semiconductor device according to another embodiment of the present invention.

In each of the above embodiments, the structure of the intelligent semiconductor device can be realized not only in a vertical structure as shown in FIGS. 1 to 3 but also in a horizontal structure although it is not shown in the accompanying drawings.

As shown in FIGS. 1 and 2, for the vertical structure, the first semiconductor layer 32 may be vertically protruded on the source region 10, and the second semiconductor layer 34 and the drain region 20 may be sequentially stacked on the first semiconductor layer 32.

Specifically, the body region 30 may be formed by vertically stacking the first semiconductor layer 32 and the second semiconductor layer 34 in a polygonal columnar shape (e.g., a rectangular columnar shape shown in FIG. 1) on the source region 10.

The biasing gate 50 and the control gate 70, as shown in FIGS. 1 and 2, may be formed on the sides of the polygonal columnar shape opposite to each other. In other case, the biasing gate 50 and the control gate 70 may be separated from each other around the polygonal columnar shape and may be formed on the sides of the polygonal columnar shape one or more, respectively.

In the embodiment of FIG. 3, the body region 30 has a rectangular columnar shape and three biasing gates 50, 52, and 54 and one control gate 70 are formed on the columnar side surface and spaced apart from each other.

Unlike the embodiment of FIG. 3, other gates can be formed, for example, two biasing gates and two control gates may be formed symmetrically each other around the body region 30 having a rectangular pillar shape. In addition, the biasing gate 50 and the control gate 70 may be formed around the body region 30 in various combinations. By these various combinations, it is possible to properly imitate the converting characteristics of short- to long-term memory in each synapse.

However, for the horizontal structure, as it is not shown in the drawings but can be seen, the source region and the drain region may be horizontally spaced apart from each other in the semiconductor substrate, and the first semiconductor layer and the second semiconductor layer may be formed horizontally between the source region and the drain region.

Specifically, the source region and the drain region may be horizontally formed and spaced apart each other in the semiconductor substrate, and the body region may be formed with the first semiconductor layer and the second semiconductor layer between the source region and the drain region having a polygonal horizontal bar shape.

Here, the biasing gate and the control gate may be spaced apart from each other on the sides of the polygonal horizontal bar shape and may be formed one or more, respectively.

The first gate insulating layer 40 may be a silicon oxide layer, the charge storage layer 64 may be a nitride layer or a silicon nitride layer, and the second gate insulating layer 60 may be formed of a tunneling oxide layer 62, a charge storage layer 64, and a blocking oxide layer 66 from the body region 30.

Next, referring to FIGS. 4 to 6, the simulation results of the structure of FIG. 1 will be described.

Figure 4:
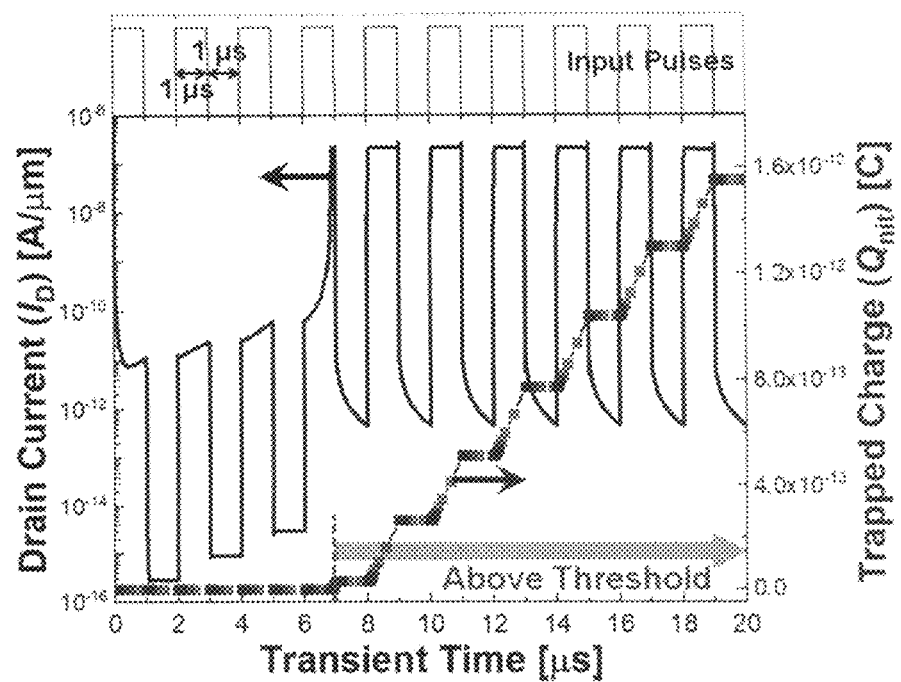
FIGS. 4 to 8 are electrical characteristic diagrams obtained as a result of simulation with the structure of FIG. 1.

FIG. 4 shows drain current $I_D$ and amount of, charge $Q_{nit}$ stored in the charge storage layer 64 when pulse voltages of −0.2 V are applied to the biasing gate 50 at the same cycle (ON time of 1 μs and OFF time of 1 μs), pulse voltages of −0.7 V are applied to the control gate 70, and pulse voltages of 0.5 V are applied to the drain region 20.

According to FIG. 4, the drain current $I_D$ increases as the pulse voltages are repeatedly applied even though the pulses of less than 1 V are applied to the four terminals. After the threshold value, the charge amount $Q_{nit}$ of the charge storage layer 64 increases and the drain current $I_D$ rapidly increases and then remains constant.

From this, it is seen that holes generated from electron-hole pairs in the depletion layer between the second semiconductor layer 34 and the drain region 20 can be injected into the quantum well of the second semiconductor layer 34 even by a low power. When holes are stored in the quantum well and exceed the threshold value, the holes flow into the charge storage layer 64 from that time, and the charge amount Qnit increases, and the drain current $I_D$ rapidly increases. As a result, it can be confirmed that the device operates well as a low-power synaptic device, i.e., an intelligent semiconductor device, which is an object of the present invention.

Figure 5:
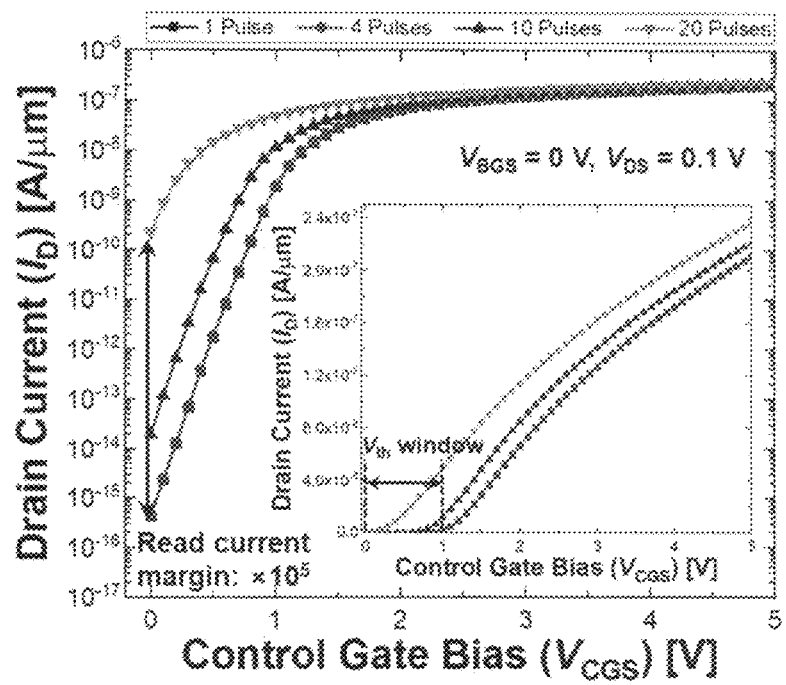

FIG. 5 is a transfer characteristic curve showing the short-term potentiation, that is, the short-term storage characteristic, in which the number of pulses applied is 1, 4, 10, and 20 having the same size described in FIG. 4, respectively. The drain current $I_D$ was expressed as a logarithmic scale along with a linear scale (inner figure).

Referring to FIG. 5, it is seen that the drain current $I_D$ is increased as the number of times of pulse application is increased, and the drain current $I_D$ is rapidly increased over a specific number of times. In FIG. 5, in the case of 20 pulses, it is increased sharply to $10^5$ fold that of 4 pulses. It shows large threshold voltage shift for the number of pulses and large current ratio for the synaptic devices having different weights.

Figure 6:
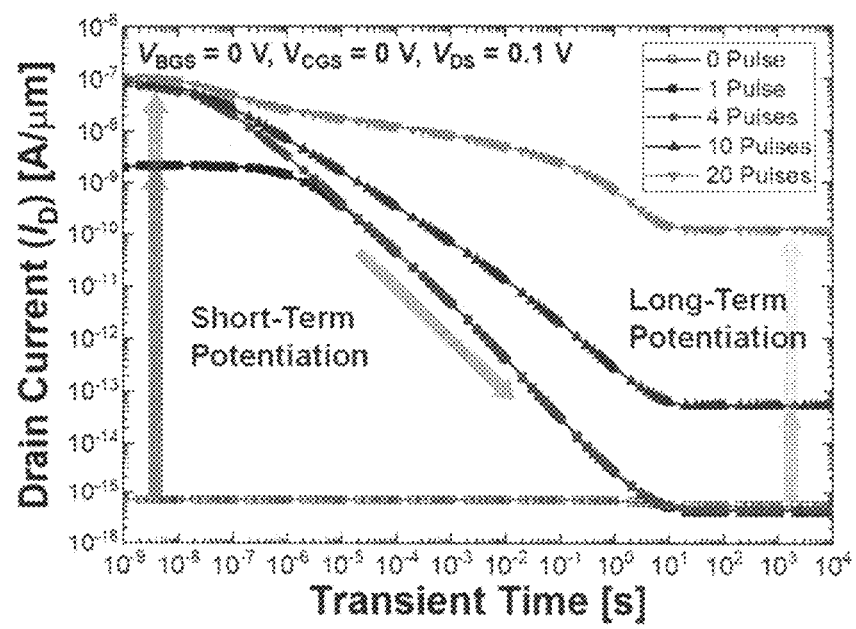

FIG. 6 is a transient characteristic curve for examining the long-term potentiation, that is, long-term memory converting characteristic, in which the number of pulses applied is 1, 4, 10, and 20 having the same size described in FIG. 4, respectively.

Referring to FIG. 6, it is seen that as the number of pulse application increases, the amount of charge $Q_{nit}$ is increased due to the flow into the charge storage layer 64. The degree that the drain current $I_D$ is reduced is small even though the time passes and from this it can be confirmed that the long-term potentiation is enhanced.

Particularly, it is seen that, in the case of 10 pulses or more, the long-term potentiation is enhanced in proportion to the number of pulses applied, and in the case of one or four pulses, only the short-term potentiation is enhanced.

From FIGS. 5 and 6, it is seen that the intelligent semiconductor device of FIG. 1 has short-term potentiation and long-term potentiation characteristics according to the number of pulses applied, and as the result can be used as a synaptic device that mimics the electrical properties of synapses.

Figure 7:
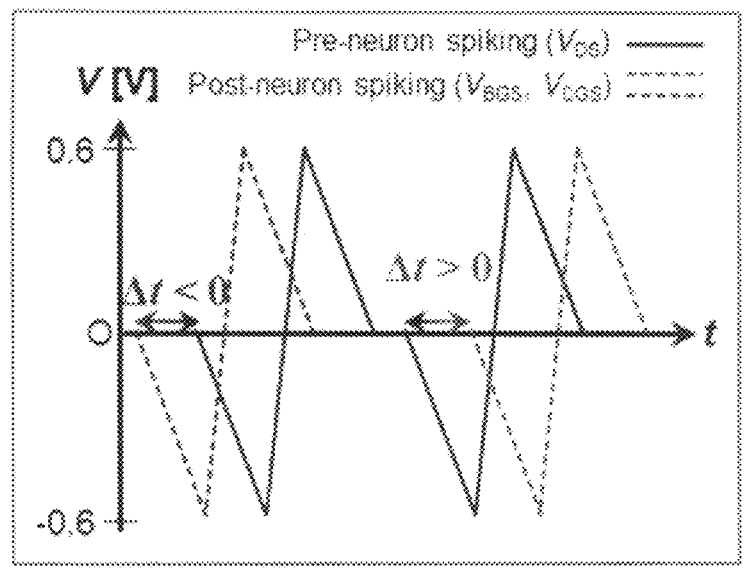
Figure 8:
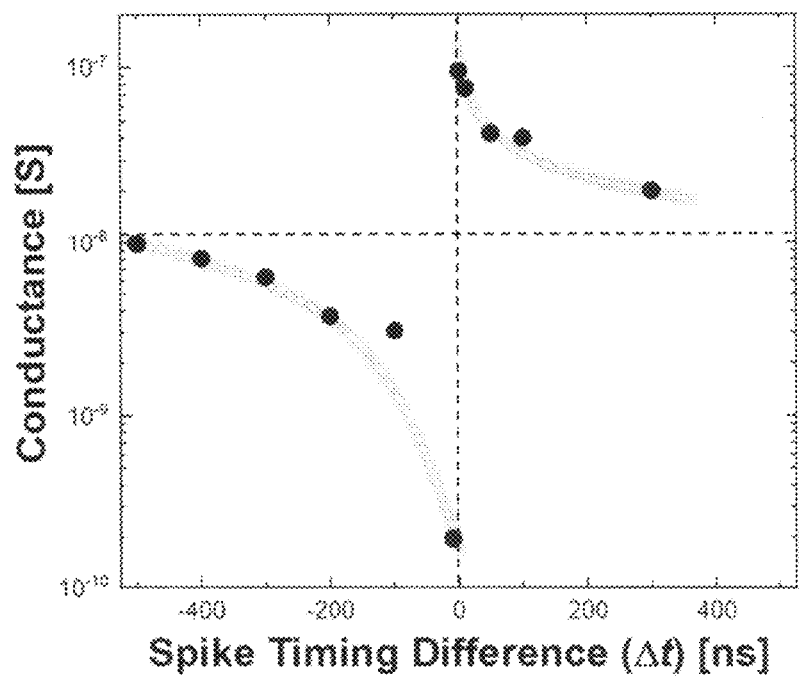

FIGS. 7 and 8 show that it is possible to mimic the Spike-Timing-Dependent Plasticity (STDP) characteristic for the intelligent semiconductor device of FIG. 1. FIG. 7 shows that the pre-neuron spiking voltages $V_{DS}$ are applied to the drain region 20 and the source region 10 as solid lines and the post-neuron spiking voltages $V_{BGS}$ and $V_{CGS}$ is applied to the biasing gate 50 and the source region 10, the control gate 70 and the source region 10, respectively, having spike time differences Δt<0 and Δt>0 as dotted lines. From FIG. 8, it is confirmed that the conductance of the intelligent semiconductor device of FIG. 1 has changed according to the spike time difference when the pre- and post-neuron spiking voltages are applied at the spike time difference Δt as shown in FIG. 7. As a result, the intelligent semiconductor device of FIG. 1 enables to be learnt by using the STDP characteristic like synapses.

This work was supported by the Nano Material Technology Development Program through the National Research Foundation of Korea (NRF) funded by the Ministry of Science and ICT (MSIT) (Grant No. NRF-2016M3A7B4910348) and by Mid-Career Research Program through NRF funded by the MSIT (Grant No. NRF-2017R1A2B2011570).

What is claimed is:

1. An intelligent semiconductor device comprising:
a body region having a first semiconductor layer, a second semiconductor layer, and a heterojunction between the first and the second semiconductor layers;
a biasing gate and a control gate spaced apart on the body region and crossing the heterojunction;
a first gate insulating layer provided between the biasing gate and the body region;
a second gate insulating layer having a charge storage layer formed between the control gate and the body region;
a source region provided at one end of the first semiconductor layer; and
a drain region provided at one end of the second semiconductor layer.

2. The intelligent semiconductor device of claim 1, wherein the second semiconductor layer has a smaller energy band gap than the first semiconductor layer.

3. The intelligent semiconductor device of claim 2, wherein the first semiconductor layer is formed to protrude vertically on the source region, and wherein the second semiconductor layer and the drain region are sequentially stacked on the first semiconductor layer.

4. The intelligent semiconductor device of claim 2, wherein the body region is formed by vertically stacking the first semiconductor layer and the second semiconductor layer in a polygonal columnar shape on the source region, and wherein the biasing gate and the control gate are spaced apart from each other on sides of the polygonal columnar shape and formed of one or more, respectively.

5. The intelligent semiconductor device of claim 2, wherein the source region and the drain region are horizontally spaced apart on a semiconductor substrate, and wherein the first semiconductor layer and the second semiconductor layer are formed horizontally between the source region and the drain region.

6. The intelligent semiconductor device of claim 2, wherein the source region and the drain region are horizontally spaced apart on a semiconductor substrate, wherein the first semiconductor layer and the second semiconductor layer of the body region have a polygonal horizontal bar shape between the source region and the drain region, and wherein the biasing gate and the control gate are spaced apart from each other on sides of the polygonal horizontal bar shape, the biasing gate and the control gate being one or more, respectively.

7. The intelligent semiconductor device of claim 1, wherein the second semiconductor layer has a quantum well between a depletion layer of the drain region and the heterojunction, and wherein the quantum well is configured to store holes generated in the depletion layer and imitate a short-term memory, the quantum well converting the short-term memory into a long-term memory by enabling holes to be injected into the charge storage layer when the holes stored in the quantum well exceed a specific threshold value.

8. The intelligent semiconductor device of claim 5, wherein the first semiconductor layer is a silicon layer, and wherein the second semiconductor layer is a silicon germanium layer.

9. The intelligent semiconductor device of claim 8, wherein the silicon layer is formed of a bulk silicon substrate, the source region being formed in the bulk silicon substrate.

10. The intelligent semiconductor device of claim 8, wherein the biasing gate and the control gate cover the depletion layer and are formed to a distance away from the source region.

11. The intelligent semiconductor device of claim 2, wherein the second semiconductor layer has a quantum well between a depletion layer of the drain region and the heterojunction, and wherein the quantum well is configured to store holes generated in the depletion layer and imitate a short-term memory, the quantum well converting the short-term memory into a long-term memory by enabling holes to be injected into the charge storage layer when the holes stored in quantum well exceed a specific threshold value.

12. The intelligent semiconductor device of claim 3, wherein the second semiconductor layer has a quantum well between a depletion layer of the drain region and the heterojunction, and wherein the quantum well is configured to store holes generated in the depletion layer and imitate a short-term memory, the quantum well converting the short-term memory into a long-term memory by enabling holes to be injected into the charge storage layer when the holes stored in quantum well exceed a specific threshold value.

13. The intelligent semiconductor device of claim 4, wherein the second semiconductor layer has a quantum well between a depletion layer of the drain region and the heterojunction, and wherein the quantum well is configured to store holes generated in the depletion layer and imitate a short-term memory, the quantum well converting the short-term memory into a long-term memory by enabling holes to be injected into the charge storage layer when the holes stored in quantum well exceed a specific threshold value.

14. The intelligent semiconductor device of claim 5, wherein the second semiconductor layer has a quantum well between a depletion layer of the drain region and the heterojunction, and wherein the quantum well is configured to store holes generated in the depletion layer and imitate a short-term memory, the quantum well converting the short-term memory into a long-term memory by enabling holes to be injected into the charge storage layer when the holes stored in quantum well exceed a specific threshold value.

15. The intelligent semiconductor device of claim 6, wherein the second semiconductor layer has a quantum well between a depletion layer of the drain region and the heterojunction, and wherein the quantum well is configured to store holes generated in the depletion layer and imitate a short-term memory, the quantum well converting the short-term memory into a long-term memory by enabling holes to be injected into the charge storage layer when the holes stored in quantum well exceed a specific threshold value.

* * * * *